United States Patent
Ni

(10) Patent No.: US 8,008,938 B2
(45) Date of Patent: Aug. 30, 2011

(54) TESTING SYSTEM MODULE

(75) Inventor: Cheng-Chin Ni, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 62 days.

(21) Appl. No.: 12/478,774

(22) Filed: Jun. 5, 2009

(65) Prior Publication Data

US 2009/0243643 A1 Oct. 1, 2009

Related U.S. Application Data

(63) Continuation-in-part of application No. 12/045,711, filed on Mar. 11, 2008, now abandoned.

(30) Foreign Application Priority Data

Oct. 24, 2007 (TW) ............................... 96139881 A

(51) Int. Cl.
*G01R 31/20* (2006.01)

(52) U.S. Cl. ......... 324/754.13; 324/754.12; 324/754.11; 324/763.01; 324/763.02; 324/754.01

(58) Field of Classification Search .......... 324/754–765, 324/158.1
See application file for complete search history.

(56) References Cited

U.S. PATENT DOCUMENTS

| | | | | |
|---|---|---|---|---|
| 4,229,693 | A * | 10/1980 | Irick et al. | 324/519 |
| 5,596,283 | A * | 1/1997 | Mellitz et al. | 324/754 |
| 5,631,565 | A * | 5/1997 | Winter | 324/511 |
| 5,717,328 | A * | 2/1998 | Kerr et al. | 324/149 |
| 5,781,024 | A * | 7/1998 | Blomberg et al. | 324/763 |
| 5,850,146 | A * | 12/1998 | Shim et al. | 324/761 |
| 6,020,747 | A * | 2/2000 | Bahns et al. | 324/754 |
| 6,759,860 | B1 * | 7/2004 | Hsiung et al. | 324/750.19 |
| 7,015,711 | B2 * | 3/2006 | Rothaug et al. | 324/758 |
| 7,068,056 | B1 * | 6/2006 | Gibbs et al. | 324/754 |
| 7,221,172 | B2 * | 5/2007 | Dunklee | 324/754 |
| 2007/0063721 | A1* | 3/2007 | Dozier et al. | 324/754 |

* cited by examiner

*Primary Examiner* — Huy Q Phan
*Assistant Examiner* — Richard Isla Rodas
(74) *Attorney, Agent, or Firm* — Perkins Coie LLP

(57) ABSTRACT

A testing system module for testing printed circuit board (PCB) includes at least one robot having a pogo pin for moving to a testing point of the PCB; a pressure detecting unit for detecting a current pressure value on the printed circuit board; and a control system for keeping the pogo pin to contact with the PCB with constant pressure.

9 Claims, 4 Drawing Sheets

TESTING SYSTEM MODULE

CROSS REFERENCE

This application is a continuation-in-part of U.S. patent application Ser. No. 12/045,711, filed on Mar. 11, 2008 now abandoned, which claims priority to Taiwan patent application No. 096139881 filed Oct. 24, 2007, all of which are incorporated by reference.

BACKGROUND OF THE INVENTION

1. Field of the Invention

The present invention relates to a testing system module for printed circuit board. More particularly, the present invention relates to a testing system module for testing short circuit, open circuit and extreme low leakage current of printed circuit board.

2. Prior Art

In the manufacturing process of printed circuit board, some electrical defects such as short circuit, open circuit, and leakage current would be caused by outside factors. Moreover, evolutions of printed circuit board are high-density, fine pitch, and multi-layer. Therefore, it would cause more cost wasting if the bad board could not be found in time. Besides the improvement of the control of manufacturing process of printed circuit board, improvement of testing technology of printed circuit board is also a good way for manufacturer to reduce scraped rate and raise quality of produce.

In tradition, the way of testing electricity of printed circuit board comprises that using three equipments to perform, which are dedicated test equipment, universal grid test equipment, and flying probe test equipment.

Regarding to dedicated test equipment, which comprises a fixture, such as a dial of testing electricity of printed circuit board. The fixture is only matched one type of printed circuit board. The other types of printed circuit board aren't tested by this dedicated test equipment. Moreover, the fixture would not be reused. Therefore, it wastes cost very much. Otherwise, leakage current of printed circuit board tested by dedicated test equipment lacks stability. The testing data lacks stability that the testing data are not accuracy and the extreme low leakage current, such as nano-ampere level or lower leakage current, could not be tested by the dedicated test equipment.

Universal grid test equipment has a big-size dial being fixture, and the big-size dial has many grids which has testing point. Thus, varied kinds of printed circuit board could be tested by the universal grid test equipment, and the universal grid test equipment does not need to change the fixture. However, as well as dedicated test equipment, leakage current of printed circuit board tested by dedicated test equipment also lacks stability. Moreover, the testing density of printed circuit board tested by universal grid test equipment has limitation. When the printed circuit board is a high-density board, the high-density board isn't tested by the universal grid test equipment.

Flying probe test equipment which merely has two probes to move on x, y, and z axes and to test any testing point of printed circuit board, therefore, it doesn't need more expensive fixture for testing. However, using flying probe test equipment to test printed circuit board still couldn't test the current range of IC testing level. Therefore, it would affect the efficiency and quality of further testing fabrication when the printed circuit board that current range of IC testing level of printed circuit board aren't tested is used to test IC. In order to solve the problem that extreme low leakage current of printed circuit board aren't tested by flying probe test equipment, in general, the testing process of this portion would be performed by extra-manpower. However, it not only wastes manpower but also adds cost of product.

Moreover, when the testing system module tests the printed circuit boards, the X, Y and Z coordinates are inputted in the controller to make the probe contacts on the printed circuit boards. However, the surface of the printed circuit boards is not so flat, and the rough surface of the printed circuit boards makes the probe not to contact the printed circuit boards precisely. Measurement inaccuracy or leakage current therefore happens.

Therefore, it's needed to find a testing system module which could combine the function of auto-continuingly testing and the function of accurately testing leakage current of printed circuit board, and keep the probe contacting the printed circuit boards precisely. Moreover, extreme low leakage current could be tested automatically, the cost of manpower and time could be saved, and the stability of testing data could be promoted.

SUMMARY OF THE INVENTION

An object of the present invention is to provide a testing system module for testing short circuit, open circuit and extreme low leakage current of printed circuit board, and for keeping the probe contacting the printed circuit boards with constant pressure to reduce the measurement inaccuracy by a pressure detecting unit and a signal transformation unit.

Another object of the present invention is to provide a testing system module, which includes automatic system module for testing extreme low leakage current of printed circuit board, and a pressure detecting unit and a signal transformation unit for preventing damages of the probe and the printed circuit boards caused by excessive pressure.

Another object of the present invention is to provide a pressure detecting unit and a signal transformation unit to maintain the probe to contact the printed circuit boards with the constant pressure and reduce the leakage current.

To achieve these objects mentioned above, the present invention provides a measuring system module which is used to measure a printed circuit board, including: a first robot having a pogo pin, wherein the first robot could be moved to a testing point of a first surface of the printed circuit board and the pogo pin could be connected with said first testing point; a second robot having another pogo pin, wherein the second robot could be moved to a testing point of a second surface of the printed circuit board and the pogo pin could be connected with the second testing point; a meter, which is used to enter/receive testing signal to the pogo pins; a control system, which is used to control the first robot and the second robot to move, and control the meter to provide and receive testing signal; and the testing signal from the meter could be transmitted to the control system for defining and analyzing the testing signal; and a pressure detecting unit and a signal transformation unit, which is used to adjust the probe along Z axis when a measurement inaccuracy signal is detected.

Therefore, the electricity of the printed circuit board could be tested accurately, and the un-standard printed circuit boards are picked up in time. The efficiency and quality of the printed circuit board is ensured for following production. The better is that the testing system module of the present invention could be controlled by a controlling system, and the testing system module could be an automatic system thereby the cost of manpower could be saved. Moreover, the pressure detecting unit and the signal transformation unit keep the probe contacting the circuit boards with constant pressure to obtain the best measurement values.

DETAILED DESCRIPTION OF THE INVENTION

Some embodiments of the invention will now be described in greater detail. Nevertheless, it should be noted that the present invention can be practiced in a wide range of other embodiments besides those explicitly described, and the scope of the present invention is expressly not limited except as specified in the accompanying claims. Note that, the components of the different elements are not shown to scale. Some dimensions of the related components are exaggerated to provide a more clear description and comprehension of the present invention.

Figure 1:
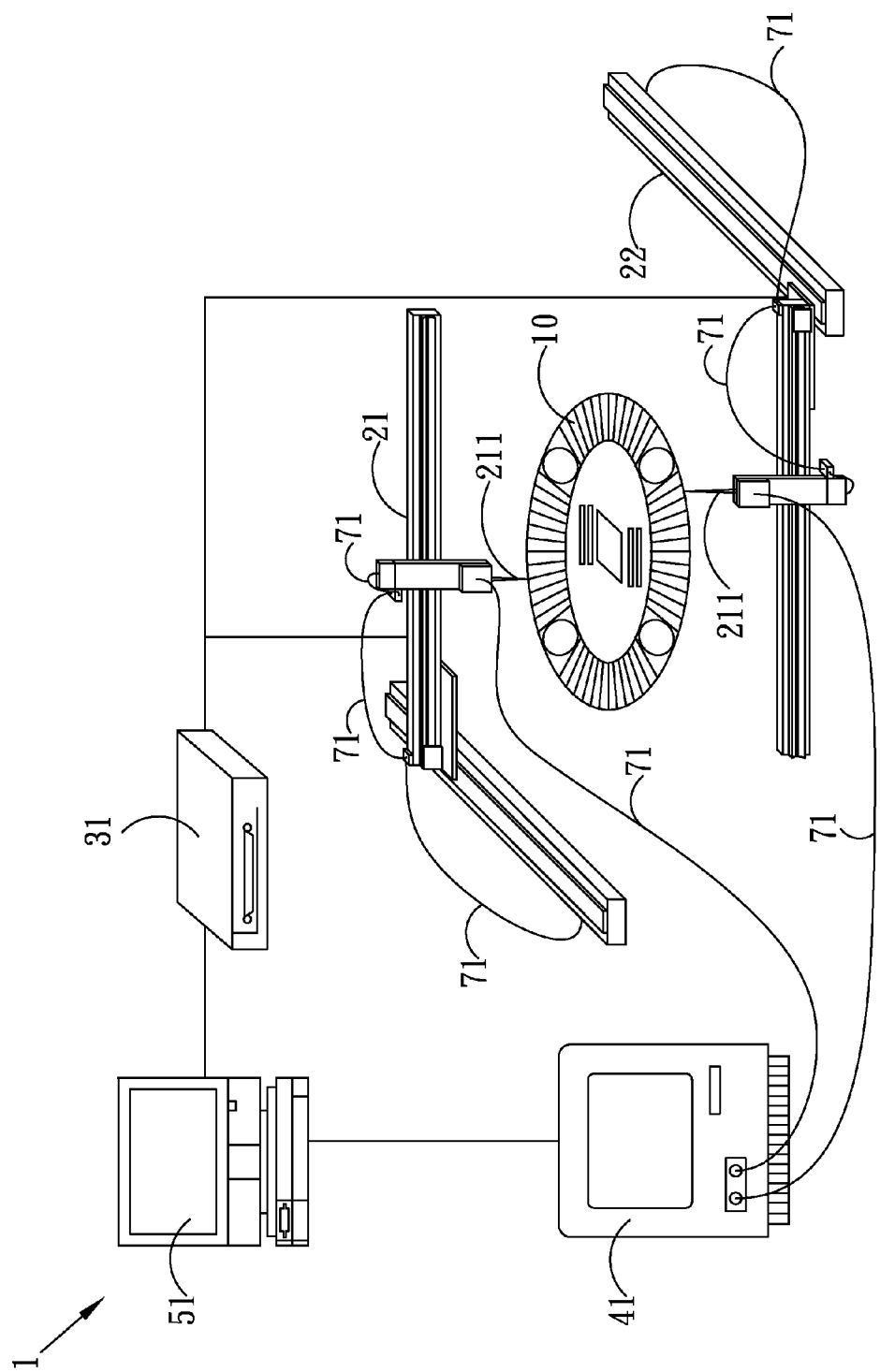
FIG. 1 is a diagram of a measuring system module of one embodiment of the present invention.

FIG. 1 shows a testing system module 1 of one embodiment of the present invention. The testing system module 1 comprises a testing part and a meter 41. The testing part is one kind of flying test equipment, which comprises a first robot 21 and a second robot 22. In here, the first robot 21 has a pogo pin 211. The printed circuit board 10 comprises a two-side printed circuit board, which has a first surface and a second surface. When testing the printed circuit board 10, the pogo pin 211 of the first robot 21 is contacted with a first testing point of the first surface of printed circuit board 10. The second robot 22 also has a pogo pin 211. Similarly, when testing the printed circuit 10, the pogo pin 211 of the second robot 22 is contacted with a second testing point of the second surface of printed circuit board 10. The purpose of using pogo pin is to avoid the testing point of printed circuit board to be damage. In this embodiment, the first robot 21 and the second robot 22 are xyz orthogonal robots, but do not limit to this. The xyz orthogonal robot is one kind of robot which could be moved along X axis, Y axis, and Z axis that the three axes are perpendicular each other.

The meter 41 is a meter which comprises a test signal generator and a detector. In this embodiment, the meter comprises a source meter, and the source meter could provide an accurately voltage signal and measure extreme low leakage current. The meter 41 is connected with the first robot 21 and the second robot 22 by signal transmission lines 71. Therefore, the electricity, such as short circuit, open circuit and leakage current, of the printed circuit board 10 could be tested by the meter 41 which is used by the pogo pin 211 of the first robot 21 and the pogo pin 211 of the second robot. Moreover, the source meter could measure nano-ampere level leakage current. Furthermore, the signal transmission line 71 covers a metal layer, which is used to avoid the effect of outside electromagnetic interference (EMI).

The testing system module 1 further comprises a control system 51, which is connected with the meter 41, the first robot 21 and the second robot 22. The control system is used to control the meter to provide a voltage to pogo pins of the first robot and the second robot. Moreover, the testing signal tested by meter 41 is received by the control system for defining and analyzing the testing signal. Otherwise, the coordinates of the first robot 21 and the second robot 22 could be controlled by the control system. The testing system module further comprises a movement driver 31, which is disposed between the control system 51 with the first robot 21 and second robot 22. The movement driver 31 could receive the instruction from the control system 51 and drive the first robot 21 and the second robot 22 moving to the testing position.

Figure 2:
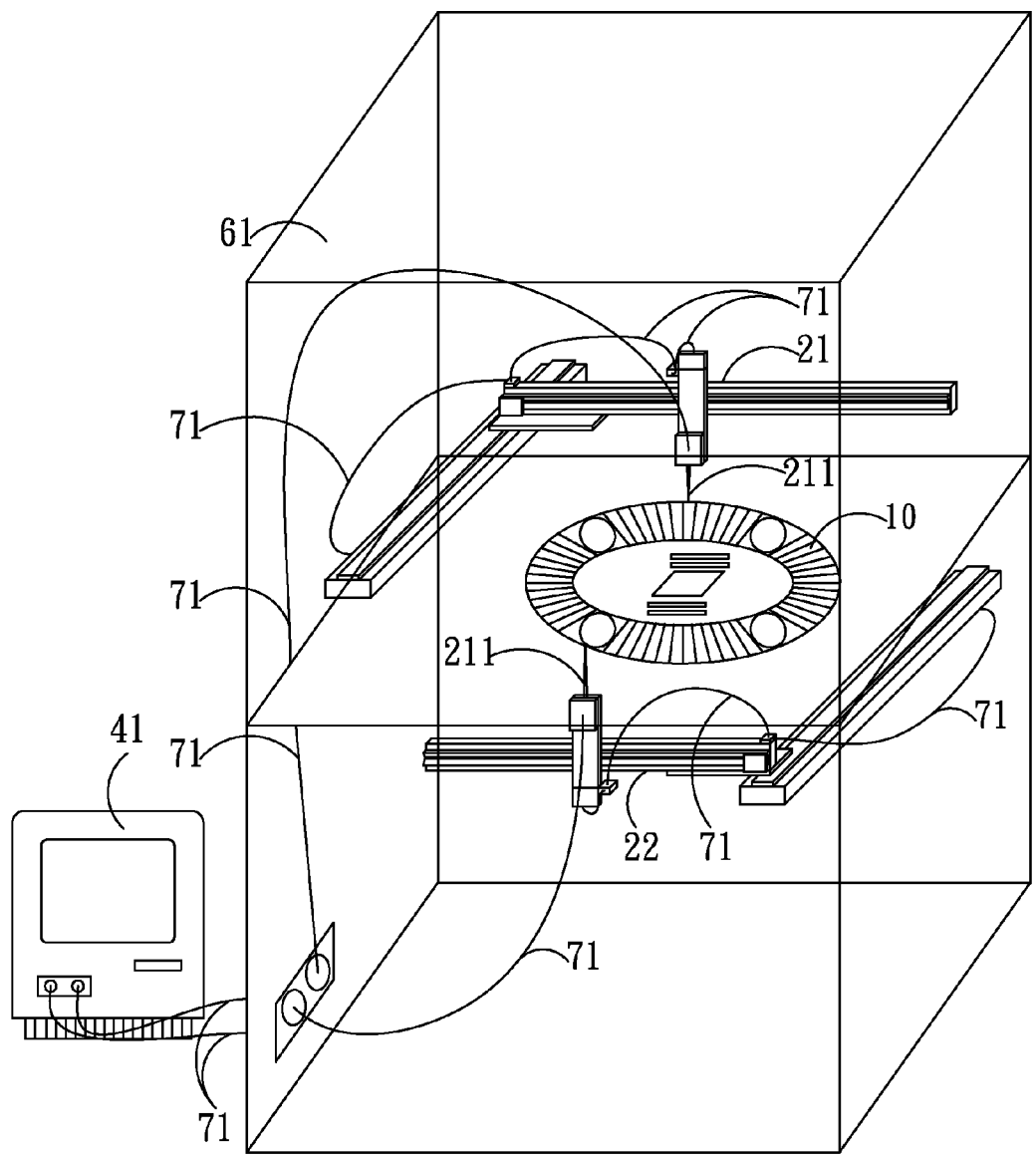
FIG. 2 is a diagram of a shielding case of the measuring system module of one embodiment of the present invention.

As shown in FIG. 2, the testing system module 1 further comprises a shielding case 61, which is used to cover the testing part to reduce outside electromagnetic interference when the printed circuit board is testing. It's meant that the shielding case 61 covers the first robot 21, the second robot 22 and the printed circuit board 10. The material of shielding case 61 comprises metal, thus, it's efficient to reduce outside electromagnetic interference.

In this embodiment of the present invention, the process that the printed circuit board is tested by the testing system module 1 is described as follow:

First of all, the coordinate of the testing point of the printed circuit board is read by the control system 51. And, the coordinate of the testing point would download automatically by the movement driver, which would control the first robot 21 and the second robot 22 to move along X axis, Y axis, and Z axis that the three axes are perpendicular each other. Moreover, the pogo pin 211 of the first robot 21 could be moved to contact the first testing point of the first surface of the printed circuit board 10, and the pogo pin 211 of the second robot 22 could be moved to contact the second testing point of the second surface of the printed circuit board 10.

Then, the control system 51 is transferred to the meter 41 by transfer protocol. The testing signal from the meter 41 is transferred to the pogo pins of the first robot 21 and the second robot 22, and the pogo pins transfer the voltage to the testing points of the printed circuit board 10 for testing. The testing process comprises short current, open current and leakage current, and the leakage current testing could test the extreme low leakage current. Moreover, the testing data could be transferred to the control system 51 by the meter 41, and the testing data of printed circuit board 10 could be defined and analyzed by the control system 51.

Otherwise, two printed circuit boards could be tested at the same time by the testing system module of the present invention. When the one-end testing point of the two printed circuit boards is grounded, the two printed circuit boards could be tested at the same time by the testing system module 1.

Therefore, the testing part of the testing system module of the present invention has the advantage of the flying probe test equipment, and the first robot and the second robot are set on two side of the printed circuit board. When testing the printed circuit board, it only has two probes to move on x, y, and z axes and to test any testing point of printed circuit board. Therefore, it doesn't need more expensive fixture for testing, and extreme high-density printed circuit board could also be tested by the testing system module of the present invention. Otherwise, the testing system module of the present invention comprises a meter 41 would could provide high voltage and receive extreme low current, thus, the testing system module could test nano-ampere level leakage current of the printed circuit board which would be set to high voltage and standard of leakage current is high. Therefore, the electricity of the printed circuit board could be tested accurately, and the un-standard printed circuit board could found in time. The efficiency and quality of the printed circuit board is ensured for following production.

The advantage of the testing system module of the present invention is that the testing system module is an automatic system. Because the meter, the first robot, and the second robot are all connected to the control system, and the voltage and testing data from the meter and the movement of the first and second robots are controlled by the control system. Therefore, it is an automatic system thereby the cost of manpower could be save.

Figure 3:
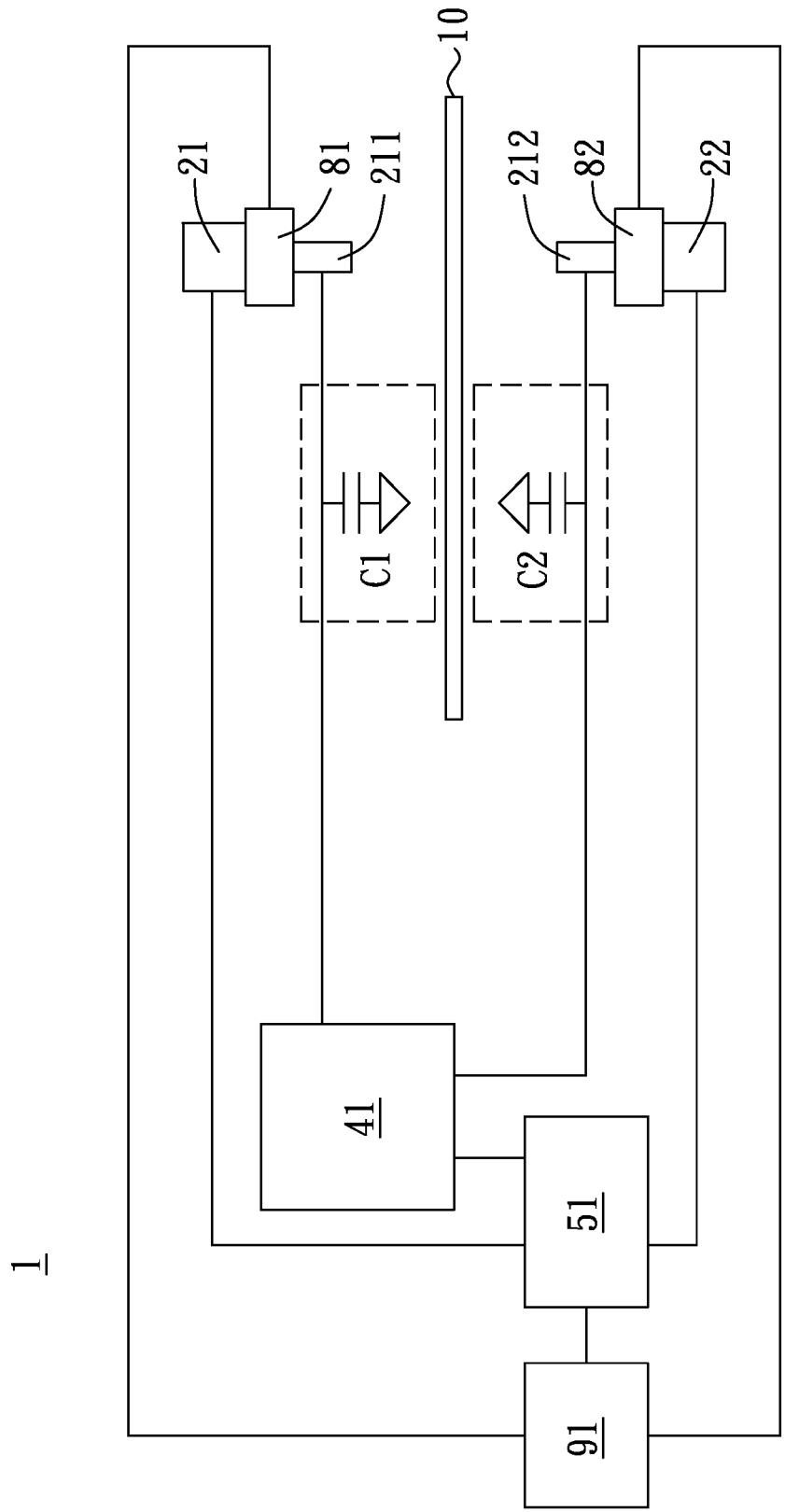
FIG. 3 is a diagram of measuring system module with pressure detection of one embodiment of the present invention.

For preventing damages of the pogo pins and the printed circuit boards caused by excessive pressure, in another embodiment of the present invention, the testing system module of the present invention can add a pressure detecting component to keep the pogo pins contacting the circuit boards with constant pressure. As shown in FIG. 3, the testing system module 1 includes a first robot 21 and a second robot 22, and further includes a first pogo pin 211 and a second pogo pin 212 connected with first robot 21 and second robot 22 respectively. The printed circuit board 10 includes a two-side printed circuit board, which has a first surface and a second surface. When testing the printed circuit board 10, the first pogo pin 211 of the first robot 21 is contacted with a first testing point of the first surface of printed circuit board 10, and the second pogo pin 212 of the second robot 22 is contacted with a second testing point of the second surface of printed circuit board 10. In this embodiment, the first robot 21 and the second robot 22 are XYZ orthogonal robots, which could be moved along X axis, Y axis, and Z axis that the three axes are perpendicular each other.

As shown in FIG. 3, the testing system module 1 further includes a first pressure detecting unit 81 and a second pressure detecting unit 82. The first pressure detecting unit 81 is connected to the pogo pin 211, and the second pressure detecting unit 82 is connected to the pogo pin 212. When the pogo pins 211 and 212 are contacted with the circuit board 10, the pressure detecting units 81 and 82 detect the pressure pressed by the pogo pins 211 and 212 on the circuit board 10, and convert the pressure into pressure signals. Furthermore, the pogo pins 211 and 212 detect the leakage current C1 and C2, convert the leakage current into leakage current measurement signals, and transmit the leakage current measurement signals to a meter 41.

As shown in FIG. 3, the testing system module 1 further includes a signal transformation unit 91, and the signal transformation unit 91 is electrically connected with the pressure detecting units 81 and 82 respectively. The signal transformation unit 91 receives the pressure signals from the pressure detecting units 81 and 82 respectively, and converts the pressure signals into digital pressure control signals.

As shown in FIG. 3, the meter 41 connected with the pogo pins 211 and 212 respectively transmits the leakage current measurement signals from the pogo pins 211 and 212 to the control system 51. The control system 51 analyzes the leakage current measurement signals and checks whether the leakage current measurement signals are in a normal range. If the leakage current measurement signals are in a normal range, it means that the pogo pins are contacted with the printed circuit board with constant pressure. The control system 51 then commands the pogo pins to move to the next location to carry out the following detection.

But if the leakage current measurement signals are not in a normal range, it means the pogo pins are not contacted with the printed circuit board precisely. As mentioned above, the pressure detecting units 81 and 82 detect the pressure pressed by the pogo pins 211 and 212 on the circuit board 10, convert the pressure into pressure signals and transmit the pressure signal to the signal transformation unit 91. The signal transformation unit 91 converts the pressure signal into a digital pressure control signals and transmits to the control system 51. The control system 51 therefore obtains the current pressure values. Then, the control system 51 calculates a best pressure value and a difference value between the current pressure and the best pressure value. The control system 51 commands the robot to move along the Z axis according to the difference value, until the leakage current measurement signals are in the normal range.

Figure 4:
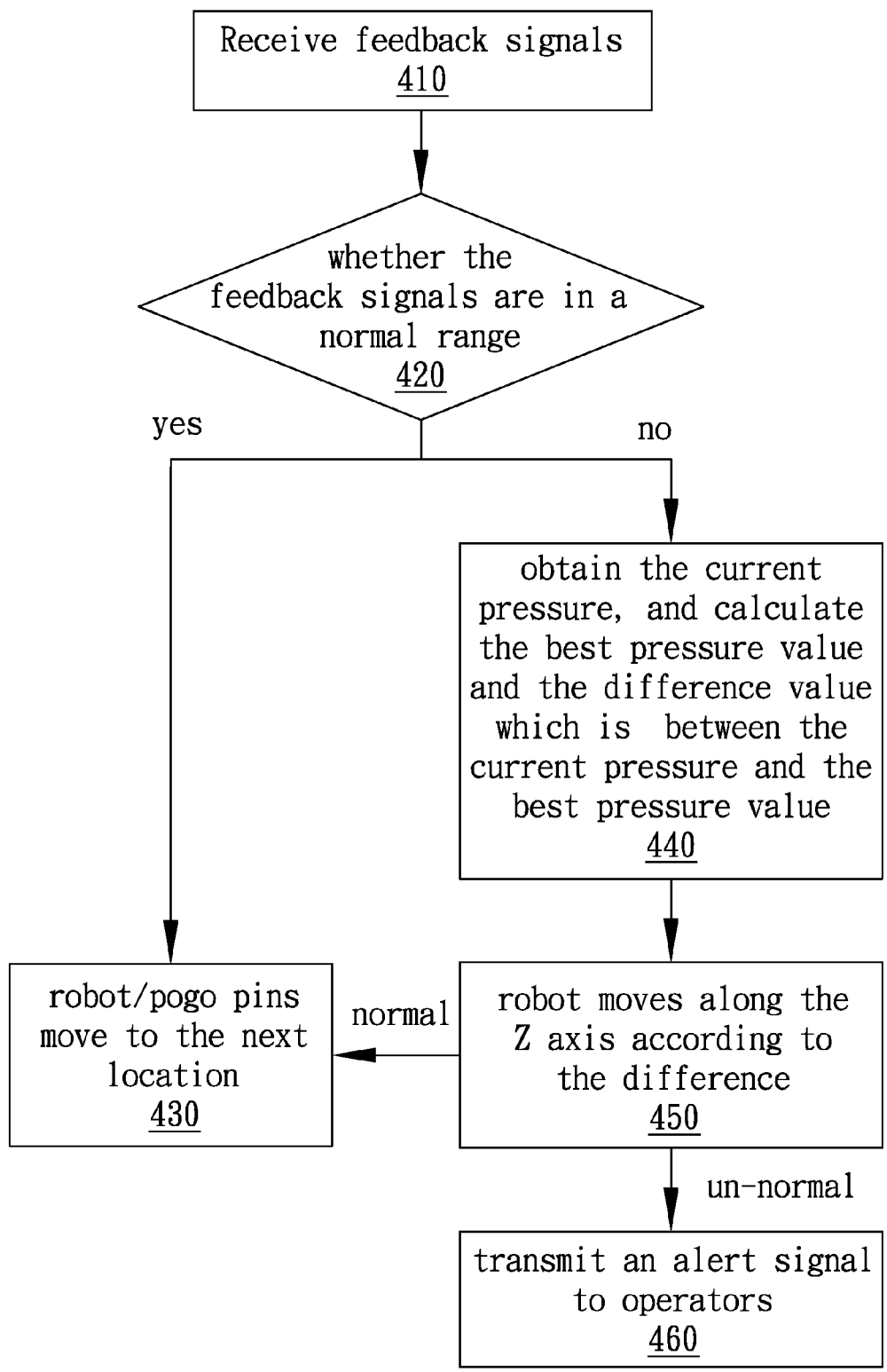
FIG. 4 is a flowchart of measuring system module with pressure detection of one embodiment of the present invention.

FIG. 4 is a flowchart of one embodiment in the present invention. In the step 410, the feedback signals, such as the leakage current measurement signals, are received by the control system. In step 420, the control system will analyze the feedback signals, and check whether the feedback signals are in a normal range. If the feedback signals are in a normal range, it means that the pogo pins are contacted with the printed circuit board with constant pressure. The control system then command the robot/pogo pins to move to the next location to carry out the following detection in step 430. But if the signals are not in a normal range, it means the pogo pins are not contacted with the printed circuit board precisely. In step 440, the control system will obtain the current pressure pressed by pogo pins on the printed circuit board from the pressure detecting units, and calculate the best pressure value and the difference value which is between the current pressure and the best pressure value. Then in step 450, the control system commands the robot to move along the Z axis according to the difference between the current pressure and the best pressure value, until the feedback signals are in the normal range. If the feedback signals are in the normal range, the step 430 is activated. If not, the control system commands the robot to stop moving, and transmits an alert signal to operators in step 460.

The specific arrangements and methods herein are merely illustrative of the principles of this invention. Numerous modifications in form and detail may be made by those skilled in the art without departing from the true spirit and scope of the invention as defined by claims.

What is claimed is:

1. A testing system module for keeping pogo pins contacted with a printed circuit board precisely, comprising:
    at least one robot having a pogo pin, wherein said robot could be moved to a testing point of a surface of said printed circuit board and said pogo pin could be connected with the surface of said printed circuit board;
    a plurality of pressure detecting units, wherein said pressure detecting units are electrically connected to said pogo pin, for detecting a current pressure value pressed by said pogo pin on said printed circuit board, and converting said current pressure value into a pressure signal;
    a signal transformation unit for transforming said pressure signal from said pressure detecting unit, into a digital pressure control signal;
    a meter which is connected electrically with said pogo pin, and said meter is used to receive testing signals from said pogo pin; and
    a control system, for determining whether said pogo pin is contacted with said printed circuit board with a constant pressure; if not, commands said pogo pin to move along the Z axis according to a predetermined value.

2. The testing system module of claim 1, wherein said predetermined pressure value is between a best pressure value and said current pressure value, and said predetermined pressure value is obtained by said control system.

3. The testing system module of claim 2, wherein said control system commands said pogo pin to move along the Z axis according to said predetermined pressure value for keeping said pogo pin to contact with said printed circuit board with a constant pressure.

4. The testing system module of claim 1, wherein said pogo pin is able to detect a leakage current.

5. The testing system module of claim 4, wherein said control system determines whether said pogo pin is contacted with said printed circuit board with a constant pressure based on whether said leakage current is in a normal range.

6. A testing method for keeping pogo pins contacted with a printed circuit board precisely, comprising:
   providing at least one pogo pin for detecting leakage current on said printed circuit board;
   providing at least one pressure detecting unit which is electrically connected to said pogo pin, for detecting a current pressure value pressed by said pogo pin on said printed circuit board;
   providing a control system for checking whether said leakage current is in a normal range;
   driving said pogo pin to move along the Z axis according to a predetermined value if said leakage current is not in a normal range; and
   driving said pogo pin to move to another test point on a surface of said printed circuit board if said leakage current is in a normal range.

7. The testing method of claim 6, further comprising a step of providing a meter which is connected electrically with said pogo pin, and said meter is used to receive testing signals from said pogo pin.

8. The testing method of claim 6, further comprising a step of providing a signal transformation unit electrically connected to said pressure detecting unit, for transforming said pressure signal from said pressure detecting unit into a digital pressure control signal.

9. The testing method of claim 6, wherein said predetermined pressure value is between a best pressure value and said current pressure value, and said predetermined pressure value is obtained by said control system.

* * * * *